(12) United States Patent
Thiery

(10) Patent No.: US 7,005,881 B2
(45) Date of Patent: Feb. 28, 2006

(54) CURRENT SENSING FOR POWER MOSFET OPERABLE IN LINEAR AND SATURATED REGIONS

(75) Inventor: Vincent Thiery, LaRoque D'Antheron (FR)

(73) Assignee: International Rectifier Corporation, El Segundo, CA (US)

( * ) Notice: Subject to any disclaimer, the term of this patent is extended or adjusted under 35 U.S.C. 154(b) by 7 days.

(21) Appl. No.: 10/746,682

(22) Filed: Dec. 23, 2003

(65) Prior Publication Data

US 2004/0227539 A1   Nov. 18, 2004

Related U.S. Application Data

(60) Provisional application No. 60/470,476, filed on May 14, 2003.

(51) Int. Cl.
*G01R 31/26* (2006.01)
*G01R 27/02* (2006.01)

(52) U.S. Cl. .................. 324/768; 324/769; 324/609
(58) Field of Classification Search ........ 324/768–769, 324/609, 76.11, 158.1, 763
See application file for complete search history.

(56) References Cited

U.S. PATENT DOCUMENTS

| 4,952,827 | A  | * | 8/1990 | Leipold et al. ............. 327/434 |
| 5,374,857 | A  |   | 12/1994 | Carobolante |
| 5,656,968 | A  | * | 8/1997 | Sander et al. ............... 327/543 |
| 6,545,513 | B1 | * | 4/2003 | Tsuchida et al. ............ 327/108 |
| 6,597,210 | B1 | * | 7/2003 | Carsten ...................... 327/108 |

FOREIGN PATENT DOCUMENTS

DE   198 38 657 A1   3/2000

* cited by examiner

*Primary Examiner*—Paresh Patel
(74) *Attorney, Agent, or Firm*—Ostrolenk, Faber, Gerb & Soffen, LLP

(57) ABSTRACT

A circuit for sensing the current through a power MOSFET in both the linear and saturated regions of operation of the power MOSFET comprising a first circuit coupled to the power MOSFET for sensing the current through the power MOSFET in the saturated region of operation of the power MOSFET and a second circuit coupled to the power MOSFET for sensing the current through the MOSFET in the MOSFET's linear region of operation.

11 Claims, 3 Drawing Sheets

CURRENT SENSING FOR POWER MOSFET OPERABLE IN LINEAR AND SATURATED REGIONS

CROSS REFERENCE TO RELATED APPLICATION

This application claims the benefit and priority of U.S. provisional patent application entitled "CURRENT SENSING DRIVER OPERABLE IN LINEAR AND SATURATED REGIONS" (IR-1851 (2-2286)), filed May 14, 2003, Ser. No. 60/470,476, the entire disclosure of which is hereby incorporated by reference herein.

BACKGROUND OF THE INVENTION

The present invention relates to power MOSFETS, and in particular, to current sensing circuits for use with power MOSFETS which enable the current through the power MOSFET to be sensed in both the linear and saturated regions of MOSFET operation.

At the present time it is known to provide current sense structures for power MOSFETs which sense the drain-source current through the power MOSFET when the power MOSFET is in the saturated region, i.e., when the drain-source voltage is less than about 3 to 4 volts. When the drain source voltage is greater than 3 to 4 volts, the MOSFET is operating in the so-called linear region. Heretofore, current sense circuits have not been provided to sense the current when the power MOSFET operates in either the linear region or the saturated region.

It is an object of the present invention to provide a current sensing circuit for a power MOSFET which will sense the current in the power MOSFET in both the saturated and linear regions of operation.

SUMMARY OF THE INVENTION

The above and other objects of the invention are achieved by a circuit for sensing the current through a power MOSFET in both the linear and saturated regions of operation of the power MOSFET comprising a first circuit coupled to the power MOSFET for sensing the current through the power MOSFET in the saturated region of operation of the power MOSFET; and a second circuit coupled to the power MOSFET for sensing the current through the power MOSFET in the MOSFET's linear region of operation.

Other features and advantages of the present invention will become apparent from the following detailed description of the invention which refers to the accompanying drawings.

BRIEF DESCRIPTION OF THE DRAWING(S)

The invention will now be described in greater detail in the following detailed description with reference to the drawings in which.

DETAILED DESCRIPTION OF THE INVENTION

Figure 1:
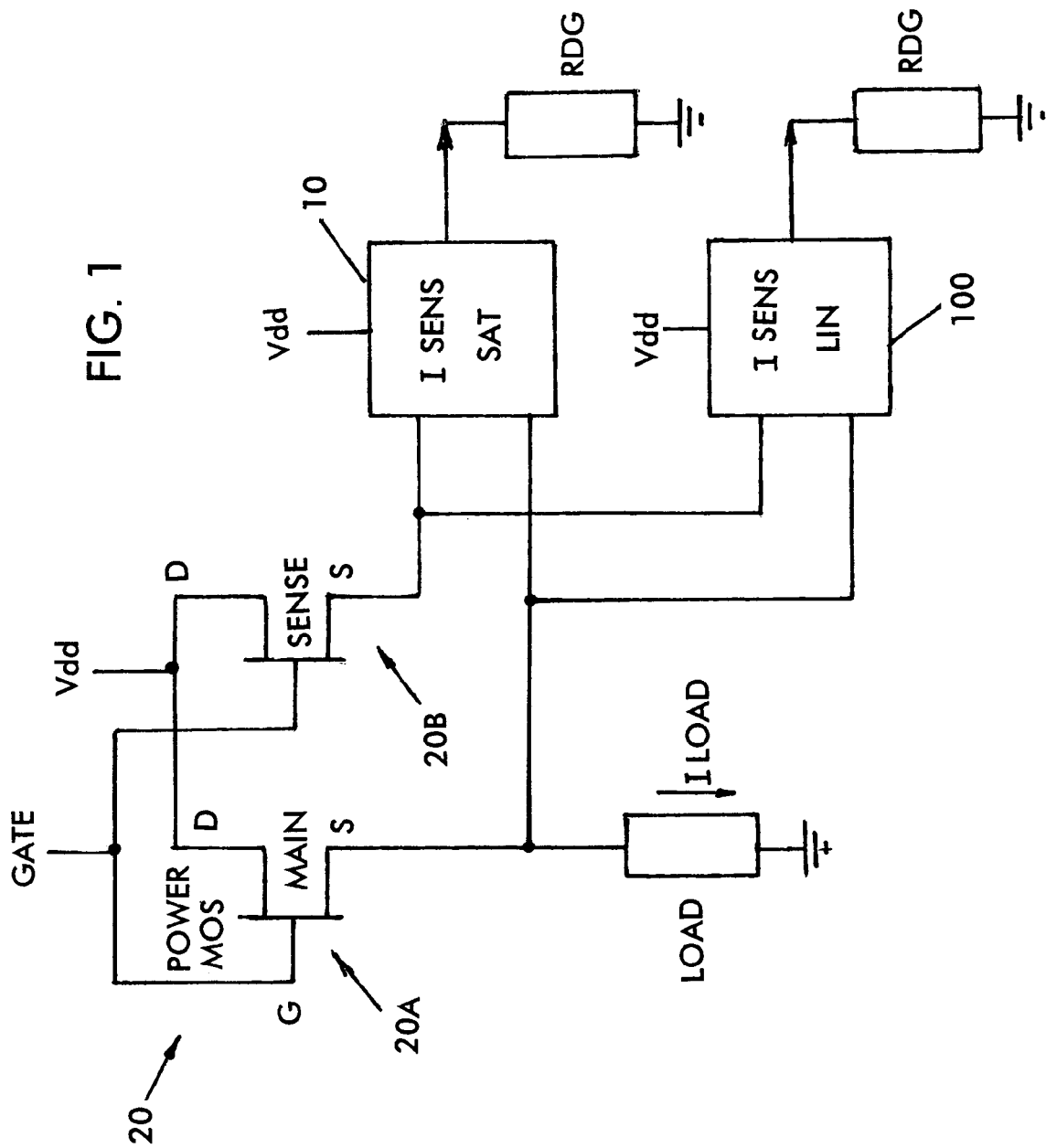
FIG. 1 shows a power MOSFET including circuits for sensing the drain-source current of the MOSFET in both the linear and saturated regions.

With reference now to the drawings, FIG. 1 shows a power MOSFET 20 which is provided with a main MOSFET cell or cells 20A for conducting the load current as well as a current sense cell or cells 20B for passing a much lower level of current, for example 10,000 times less current than in the main MOSFET, and which is proportional to the main MOSFET current, in this case, by a factor of 1/10,000. Two current sensing circuits are provided, the first circuit 10 for sensing current in the saturated region, and the second circuit 100 for sensing current in the linear region. The sensed current is detected as a voltage across a resistor RDG in each case.

Figure 2:
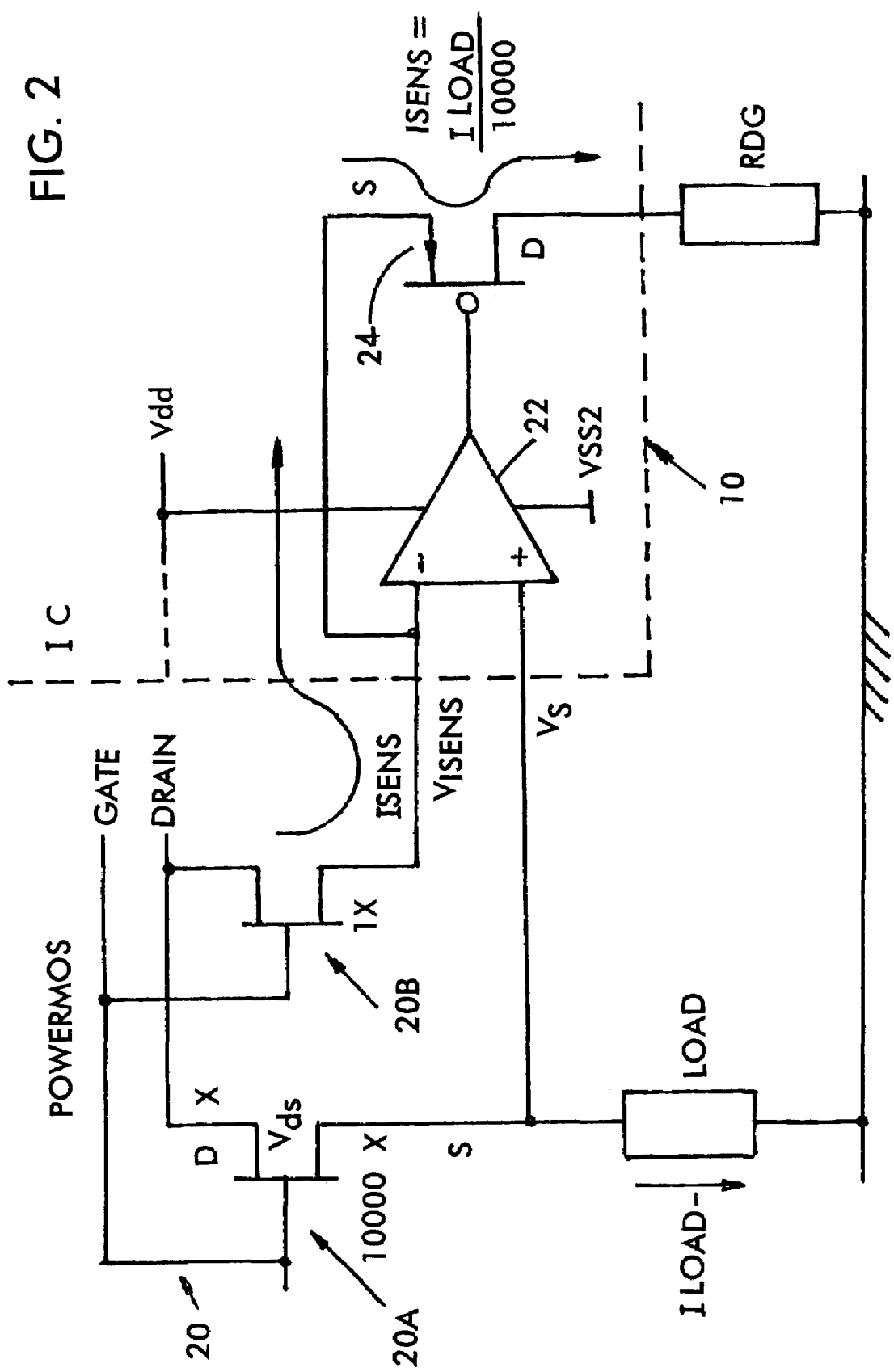
FIG. 2 shows a a part of the circuit of FIG. 1 for sensing the drain-source current in the power MOSFET in the saturated region of operation.

Turning to FIG. 2, the circuit of FIG. 1 for sensing current in the saturated region of operation is shown. In particular, the circuit shown operates when the drain-source voltage is less than approximately 3–4 volts. The power MOSFET is indicated at 20 and includes a main FET cell or cells 20A and a current sense cell or cells 20B. Load current I Load flows through the load as shown. A sense current isens is provided to the inverting input of an amplifier 22. The source of the power MOSFET is provided to the non-inverting input of the amplifier 22. The amplifier 22 is provided with positive and negative power supplies Vdd and Vss2. The output of the amplifier 22 is provided to an FET 24, in this case a P-channel device 24. The drain of device 24 is connected to a diagnostic output load, for example a resistor Rdg. The current through resistor Rdg will be proportional to the current I load through the load and the voltage across Rdg proportional to the load current I load.

The circuit operates as follows: When Vds of MOSFET cells 20A is less than approximately 3–4 volts and because the amplifier 22 is biased between supply Vss2 and the drain voltage Vdd, the amplifier provides an output only if the drain-source voltage of the power MOSFET is approximately less than 3–4 volts. Accordingly, the current through Rdg will be a measure of the current through the load only when the power MOSFET is on, not when the MOSFET is in its active clamp stage or during turn on or turn off, i.e., when the MOSFET is in its so-called linear mode and the drain-source voltage exceeds 3–4 volts.

The amplifier 22 sinks current from the current sense cells 20B so that the voltage at the inverting input, i.e., voltage $V_{isens}$ equals the voltage Vs at the non-inverting input $V_s$. Once the voltages are equal at the inverting and non-inverting inputs, the current sense cells 20B will have a voltage across them equal to the voltage Vds of the main power transistor. The current I sens is therefore proportional to the main cell 20A current in the ratio of the cells in the sense cells 20B to the main transistor cells 20A. For example, the ratio 1/10,000. Accordingly, amplifier 22 will drive P-channel MOS device 24 sot that the voltage at the inverting input of amplifier 22 follows the voltage at the non-inverting input. The source of device 24, connected to the amplifier inverting input, will sink the current I sens. The current through device 24 and thus through resistor Rdg will follow and the voltage across Rdg will be a measure of the current in the MOS device 20A when it is in its saturated mode of operation i.e., when Vds is less than or equal to about 3–4 volts. Since the amplifier is biased between Vss2 and the drain voltage, it only provides the diagnostic output when the voltage Vds is less than about 3–4 volts, i.e., when the power MOSFET is in its saturated region of operation.

When Vds exceeds about 3–4 volts, the output is zero.

Figure 3:
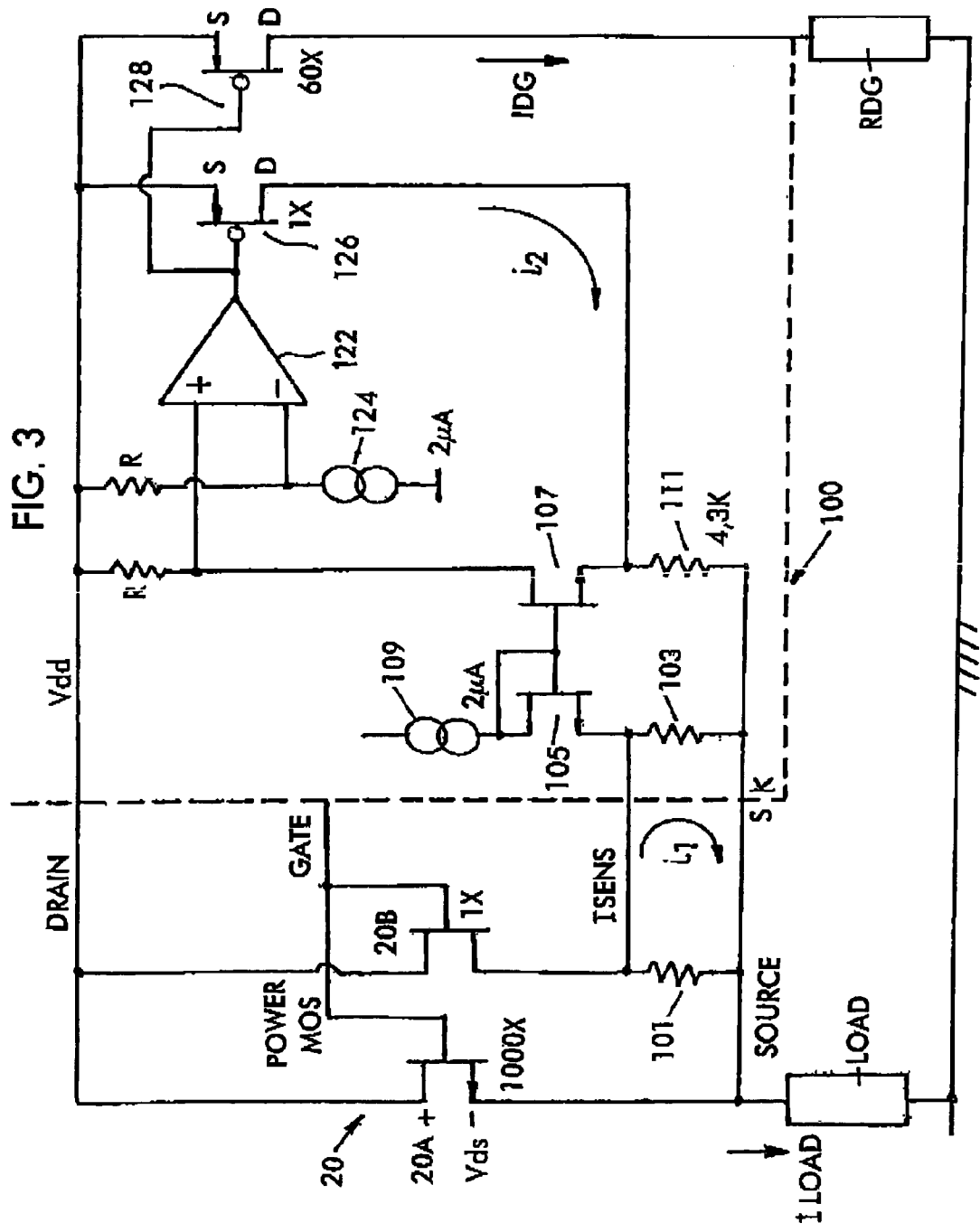
FIG. 3 shows a part of the circuit of FIG. 1 for sensing the drain-source current in the power MOSFET in the linear region of operation.

FIG. 3 shows the circuit 100 which is coupled to the power MOSFET to sense the current through the power MOSFET when it is in its linear region of operation, for example, when it is switching on or off and Vds is greater than about 3–4 volts. A resistor 101 is coupled in series with the current sense cell or cells of the power MOSFET. A further resistor 103 is provided in a current divider arrangement with the resistor 101. First and second MOSFETs 105 and 107 are provided in a current mirror arrangement. A current source 109 is coupled to the current mirror arrangement. A third resistance 111 is coupled to the source of transistor 107 and mirrors the current through resistor 103 in a defined ratio.

The inverting input of an amplifier 122 is coupled to receive a voltage reference provided by a current source 124 coupled in series with a resistance R. The non-inverting input is coupled to the drain of the transistor 107 and to the drain potential Vdd of the main power MOSFET through a second resistor R. The output of the amplifier is coupled to first and second P-channel devices 126 and 128 having their gates coupled together and their sources connected to the drain potential of the main power MOSFET. The drain of device 126 is coupled to the source of transistor 107 and the drain of the second device 128 is coupled to the diagnostic output which is coupled to resistance RDG to ground.

The devices 126 and 128 are further provided so that the ratio of currents through the devices is in a defined ratio, e.g., in the ratio of 1 to 60, as shown.

The circuit operates as follows:

The current i2 is proportional to the current i1 in approximately the ratio of resistor 103 to resistor 111. Due to the current mirror arrangement of transistors 105 and 107, the current through resistor 111, which is approximately equal to i2, will be approximately current i1 times R103/R111. In the illustrated embodiment, R103 is 150 ohms and R111 is 4300 ohms. Due to the current ratio between devices 128 and 126, IDG will be approximately equal to 60 times i2 or 60 times R103/R111 times i1. In the illustrated embodiment, this is approximately 2 times R1. The reason for the factor of 2 is that the voltage drop across the resistor 103 is large and affects the ratio of current i1 to current I Load. This factor of 2 approximately corrects the I sens to source offset effect. To have the same ratio during linear mode and saturation mode can be achieved by trial changing the value of resistor 111. To increase stability, IDG is driven in open loop. The resistor 101 has little influence because of its relatively high resistance compared to resistor 103 and protects against electrostatic discharge when the dies are unconnected.

When the current to the load increases, the current I sens also increases since the current sense cell 20B is connected in series with parallel resistors 101 and 103 across the drain-source connection. The voltage across resistor 101 and accordingly across resistor 103 likewise increases, increasing the current through device 105 which is mirrored by device 107. When the current through transistor 107 increases, the voltage at the non-inverting input of amplifier 122 decreases, driving the output of the amplifier 122 more negatively and biasing transistors 126 and 128 on more positively, increasing current i2 and IDG. As current i2 increases, the current in transistors 107 and 105 decrease reducing the voltage level on the non-inverting input until the voltages at the inputs to the amplifier are again equal. The voltage across resistor RDG will thus be proportional to the current through the main power MOSFET 20A.

If Vds across the power MOSFET falls below about 3 to 4 volts, the sense circuit of FIG. 2 senses the current from I sens so that the I sens-sk (source) voltage difference goes to 0 volts. The voltage across the resistors 101 and 103 thus goes to 0 and transistors 105 and 107 are thus turned off. Current i2 drops to 0 so that the output of the circuit of FIG. 3 is shut off and the circuit of FIG. 2 then produces an output proportional to the current in the saturated region of operation of the MOSFET.

When the voltage Vds goes above approximately 3–4 volts, i.e., the power MOSFET is in the linear region, because of the biasing of amplifier 22 of FIG. 2 between Vdd and Vss2, it ceases to provide an output and the circuit of FIG. 3 provides an output (linear region).

Accordingly, the two circuits shown in FIGS. 2 and 3 operate together such that the circuit of FIG. 2 produces an output when the voltage across the power MOSFET is approximately 3 to 4 volts or less and the power MOSFET is operating in the saturation region and the circuit of FIG. 3 operates when the voltage is above 3 to 4 volts and the MOSFET is in the linear region of operation.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A circuit for sensing the current through a power MOSFET in both the linear and saturated regions of operation of the power MOSFET comprising:
    a first circuit coupled to the power MOSFET for sensing the current through the power MOSFET in the saturated region of operation of the power MOSFET; and
    a second circuit coupled to the power MOSFET for sensing the current through the MOSFET in the MOSFET's linear region of operation,
    wherein the second circuit comprises a resistance coupled in series with the current sense cell, and a current mirror coupled to the resistance providing a current mirror output, whereby a current provided by the current mirror output is proportional to the current through the current sense cell, and further comprising an amplifier coupled to the current mirror output and coupled to a reference voltage, the amplifier producing an output proportional to the current from the current mirror and proportional to the current in the main cell of the power MOSFET.

2. The circuit of claim 1 wherein the first circuit is responsive to a drain-source voltage of the power MOSFET of a certain voltage or less and the second circuit is responsive to a drain-source voltage of the power MOSFET of the certain voltage or greater.

3. The circuit of claim 2, wherein the certain voltage is approximately 3–4 volts.

4. The circuit of claim 2, wherein the power MOSFET includes a main cell for passage of load current and a current sense cell and wherein the first circuit comprises an amplifier coupled to the main cell and to the current sense cell and having first and second power supplies whereby the first circuit is responsive to power MOSFET drain source voltages less than or equal to the certain voltage, the amplifier providing an output across a resistance whereby the voltage across the resistance is proportional to the current in the power MOSFET main cell.

5. The circuit of claim 4, wherein the output of the amplifier of the first circuit is connected to the control electrode of a further transistor whose main electrodes are connected in series with the resistance.

6. The circuit of claim 5, wherein the amplifier of the first circuit drives the further transistor so that a voltage drop across the current sense cell is equal to the voltage drop across the main cell of the power MOSFET.

7. The circuit of claim 4, wherein the first circuit amplifier is biased so as to provide an output when the drain-source voltage of the power MOSFET is below a certain level and ceases to provide an output when the drain-source voltage is above the certain level, and the second circuit amplifier operates to provide an output when the drain source voltage is above the certain level and ceases to provide an output when the drain -source voltage is below the certain level.

8. The circuit of claim 1, wherein the amplifier of the second circuit is coupled to a further transistor, the further transistor being coupled in series with a resistance across which a voltage proportional to the current through the main cell of the power MOSFET is developed.

9. The circuit of claim 1, wherein the second circuit further comprises first and second transistors having their control electrodes coupled to the output of the amplifier of the second circuit, the first of the transistors being coupled to the current mirror for providing a feedback signal to the amplifier and wherein the second transistor is coupled to a resistance across which a voltage proportional to the current in the main cell of the power MOSFET is developed.

10. The circuit of claim 9, wherein the second transistor is coupled to the resistance in open loop.

11. The circuit of claim 9, wherein the ratio of currents in the first and second transistors is preset.

* * * * *